US008456266B2

(12) United States Patent
Frye

(10) Patent No.: US 8,456,266 B2

(45) Date of Patent: Jun. 4, 2013

(54) TRANSFORMER COIL ASSEMBLY

(75) Inventor: Curtis Frye, Saltville, VA (US)

(73) Assignee: Engineered Products of Virginia, LLC, Saltville, VA (US)

( * ) Notice: Subject to any disclaimer, the term of this patent is extended or adjusted under 35 U.S.C. 154(b) by 0 days.

(21) Appl. No.: 12/819,725

(22) Filed: Jun. 21, 2010

(65) Prior Publication Data

US 2011/0006871 A1 Jan. 13, 2011

Related U.S. Application Data

(60) Provisional application No. 61/219,273, filed on Jun. 22, 2009.

(51) Int. Cl.

| | |
|---|---|
| ***H01F 27/30*** | (2006.01) |
| ***H01F 7/06*** | (2006.01) |
| ***H05K 3/30*** | (2006.01) |

(52) U.S. Cl.
USPC ........... 336/185; 336/205; 336/206; 336/196; 29/602.1; 29/606; 29/841

(58) Field of Classification Search
USPC ......... 336/222, 185, 205, 206, 196; 29/602.1, 29/606, 841
See application file for complete search history.

(56) References Cited

U.S. PATENT DOCUMENTS

| | | | | |
|---|---|---|---|---|
| 4,275,109 | A | 6/1981 | Urban et al. | |
| 4,944,975 | A | 7/1990 | Sheer | |
| 6,377,156 | B2 * | 4/2002 | Farrar et al. | 336/200 |
| 6,624,734 | B2 | 9/2003 | Lanoue et al. | |
| 2002/0047768 | A1 * | 4/2002 | Duffy | 336/145 |
| 2003/0058076 | A1 | 3/2003 | Lanoue et al. | |
| 2005/0275496 | A1 | 12/2005 | Pauley, Jr. et al. | |
| 2006/0220773 | A1 * | 10/2006 | Su et al. | 336/200 |
| 2007/0220738 | A1 * | 9/2007 | Pauley et al. | 29/602.1 |
| 2008/0024256 | A1 | 1/2008 | Pauley et al. | |
| 2010/0164669 | A1 * | 7/2010 | Soendker et al. | 336/200 |

FOREIGN PATENT DOCUMENTS

| | | |
|---|---|---|
| JP | 56-79418 | 6/1981 |
| JP | 57-52107 | 3/1982 |
| WO | WO-03/107364 | 12/2003 |

OTHER PUBLICATIONS

Prevost et al. (1989). "Conductor Insulation Tests in Oil Aramid vs. Kraft," *Electrical Insulation Magazine, IEEE* 5(4):10-14.

PCT International Search Report and Written Opinion mailed Sep. 21, 2010 directed towards international application No. PCT/US2010/039521; 10 pages.

Extended European Search Report dated Nov. 2, 2012, directed to European Application No. 10792580.2; 6 pages.

* cited by examiner

*Primary Examiner* — Mohamad Musleh
*Assistant Examiner* — Ronald Hinson
(74) *Attorney, Agent, or Firm* — Morrison & Foerster LLP

(57) ABSTRACT

A vacuum cast or "solid" transformer coil assembly and a method of manufacturing thereof are provided. A solid transformer coil assembly, according to an embodiment of the invention, includes a dielectric substrate, the coil windings provided around the substrate, and an epoxy compound encapsulating the substrate and the coil windings. The substrate is provided with raised "buttons" comprising the same epoxy material as the epoxy compound used for encapsulation. The buttons maintain a specific distance between the coil and the dielectric substrate. The buttons are arranged such that they support the windings and allow the encapsulating epoxy to flow around them flooding the entire mold without entrapping air or creating voids.

4 Claims, 8 Drawing Sheets

TRANSFORMER COIL ASSEMBLY

CROSS-REFERENCE TO RELATED APPLICATION

This application claims the benefit of U.S. Provisional Application Ser. No. 61/219,273, filed Jun. 22, 2009, the entire contents of which is incorporated herein by reference.

FIELD OF THE INVENTION

This relates to a transformer coil assembly including a dielectric substrate with integrated stand-offs molded in-place to facilitate the flow of dielectric compound into and around the coil.

BACKGROUND OF THE INVENTION

There are three basic types of power transformers: an open ventilated dry or "open wound" type, a vacuum cast or vacuum encapsulated "solid cast" type, and an "oil filled" type. "Open wound" transformers are the oldest products and are typically made of either layer windings or, step/precision windings in combs. The completed coil or sometimes the entire unit is then dipped into varnish and a coating of environmental and mechanical protection material added per a "dip-and-bake" cycle. These units are the most polluting as they typically contain two petroleum based components (film insulated magnet wire and polyester winding combs) and utilize a third component (varnish) during their respective manufacturing processes. Further, the film insulated magnet wire is manufactured by applying a solvent based material to round or shaped conductor. The solvents or volatile organic compounds are volatilized or emitted into the atmosphere as the polymers are cured. The polyester winding combs are also petroleum based and are typically machined in-house, thus creating dust or air pollution. The final dip-and-bake process also emits about 50% of the solvents (VOC's or HAPs) into the atmosphere as the units are cured.

Vacuum cast or "solid" cast transformers are superior to open wound transformers. The coils are typically made of copper without using any film insulated magnet wire and do not require winding combs. The final encapsulation may include epoxy material and thus emits no VOC's. These transformers are made by casting and curing a thermosetting resin composition around conductor windings to form a resin body covering a coil. The resin body contributes dielectric properties as well as structural reinforcement to the conductor windings. The resin provides impact protection and helps dissipate heat from the coil uniformly.

"Oil filled" transformers typically utilize lower temperature paper based products as ducting to provide physical space between conductors and as a conduit for the insulating fluid. The ducting material is typically adhered to pressboard or a similar material using a secondary adhesive. The dielectric is achieved by flooding the entire unit in an electrically insulating fluid, petroleum or non petroleum based oil.

BRIEF SUMMARY OF THE INVENTION

A vacuum cast or "solid" transformer coil assembly and a method of manufacturing thereof are provided. A solid transformer coil assembly, according to an embodiment of the invention, includes a dielectric substrate, the coil windings provided around the substrate, and an epoxy compound encapsulating the substrate and the coil windings. The substrate is provided with raised "buttons" comprising the same epoxy material as the epoxy compound used for encapsulation. The buttons maintain a specific distance between the coil and the dielectric substrate. The buttons are arranged such that they support the windings and allow the encapsulating epoxy to flow around them flooding the entire mold without entrapping air or creating voids.

According to an embodiment of the invention, the buttons are molded onto the dielectric or mechanical substrate such that the transformer is manufactured as a single homogeneous unit. The buttons may be provided by, for example, applying epoxy to the substrate in liquid form and curing the exopy button on the substrate in place.

According to an embodiment, a similar technique may be used to mold ductings on a substrate made of paper or similar material without using a secondary adhesive. The substrate may include material such as but not limited to, paper, polyester, polyester film, aramid paper such as Nomex®, cellulose, Kraft paper, organic and inorganic papers, laminates such as DMD and woven and non woven materials. Such combination of the ducting and the substrate would thus be provided as a homogenous unit. Layers of coil separated by paper material or other similar material listed above may then be wound around the substrate. The entire unit is then flooded with in electrically insulating fluid, petroleum or non petroleum based oil.

According to an embodiment of the invention, a two stage method of forming a homogeneous solid state vacuum cast or solid cast transformer coil assembly is provided. Raised "buttons" comprised of the same epoxy that is used to encapsulate the transformer coil are molded in situ to one surface of a dielectric or mechanical substrate. The substrate is then cut and rolled to form a cylindrical bobbin with the "buttons" on the outer or inner surface. When the conductors are wound around the bobbin, the "buttons" maintain a specific distance between the conductors and the dielectric substrate. The bobbin is placed in a mold and epoxy is injected or poured into it. The buttons are arranged such that they support the windings and allow the encapsulating epoxy to flow around them flooding the entire mold without entrapping air or creating voids.

When the epoxy in the vacuum cast or "solid cast" transformer fully encapsulates the coils and the dielectric substrate, it forms a solid mono-block of homogeneous epoxy. The transformer coil may comprise several layers of these materials, i.e., additional layers of dielectric substrates may be provided, as well as additional layers of coil windings and epoxy resin.

According to an embodiment of the invention, the epoxy buttons are molded to the dielectric substrate prior to encapsulation to ensure a consistent distance between the substrate and the windings. The buttons are made substantially of the same or similar epoxy material used for encapsulating the transformer coil assembly. The buttons are molded onto the dielectric substrate in such a manner as to support the windings prior to encapsulation. The buttons are sized and shaped to facilitate the air free encapsulation of the coil with epoxy.

For vacuum or solid cast transformers, the dielectric substrate, according to embodiments of the invention, can be any dielectric material such as, but not limited to, glass fibers or electrical grade glass, including polyphenylene sulfide (PPS), polyamides (nylon), polyvinyl chloride (PVC), flouropolymers (PTFE), and the like. The fabric for oil filled transformers can include paper, polyester, polyester film, aramid paper such as Nomex®, cellulose, Kraft paper, organic or inorganic paper, and laminates such as DMD. The material used for dielectric substrate may be organic or nonorganic. The material may also be woven or nonwoven. The dielectric substrate may be made material such as, but not limited to, fibers formed in grid-like pattern, formed as a solid surface, or formed in parallel continuous or non-continuous rows. Such material may be applied to vacuum cast or solid cast transformers as well as oil filled transformers.

In embodiments of the invention, the buttons may be molded onto the substrate without a use of any adhesive. This eliminates concerns about failure of the adhesive material between the buttons and the substrate as well as short-term and long-term compatibility of the adhesive chemical material.

Further, the formed-in-place buttons, which may be made of epoxy, impregnate the fibers of the substrate and thus eliminate air entrapment. The buttons may be designed with a profile that facilitates encapsulation eliminating voids and potential for transformer failure due to corona discharge. In an embodiment of the invention, since the buttons are molded in place, they can be designed and shaped in various patterns to accommodate non-conventional transformer configurations.

DETAILED DESCRIPTION OF THE INVENTION

Figure 1:
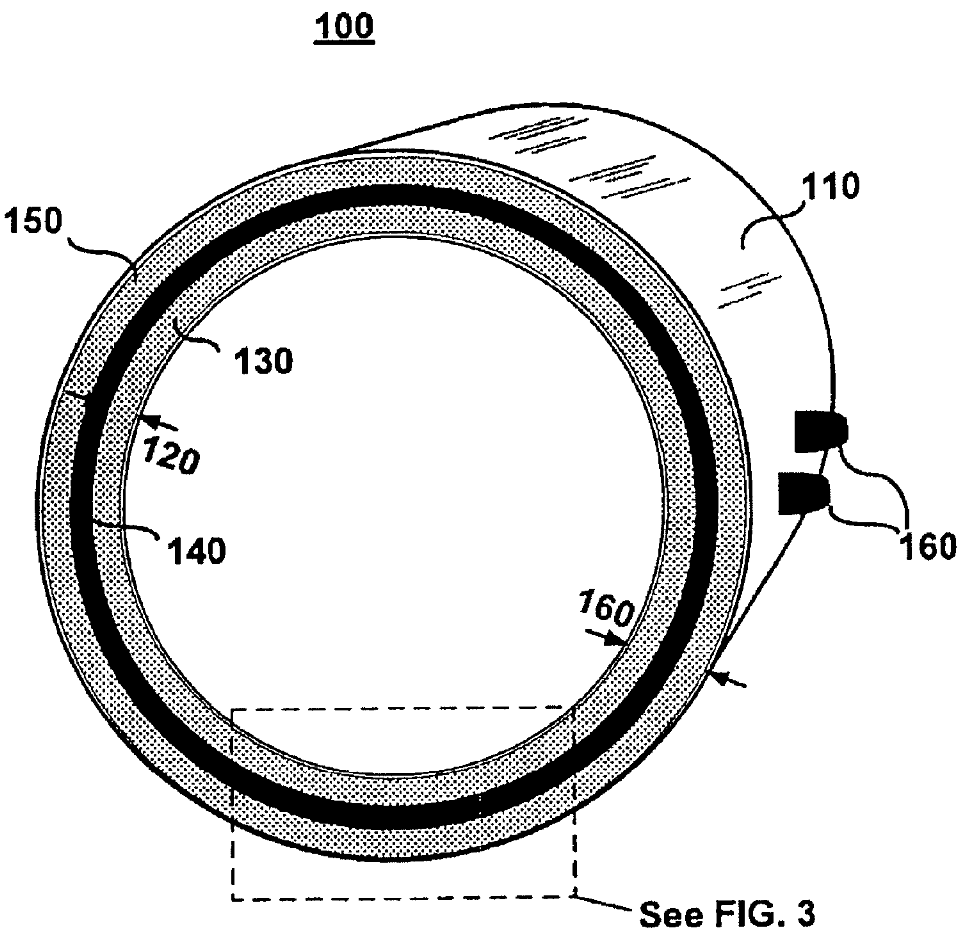
FIG. 1 is a perspective view of a transformer coil assembly.
Figure 3:
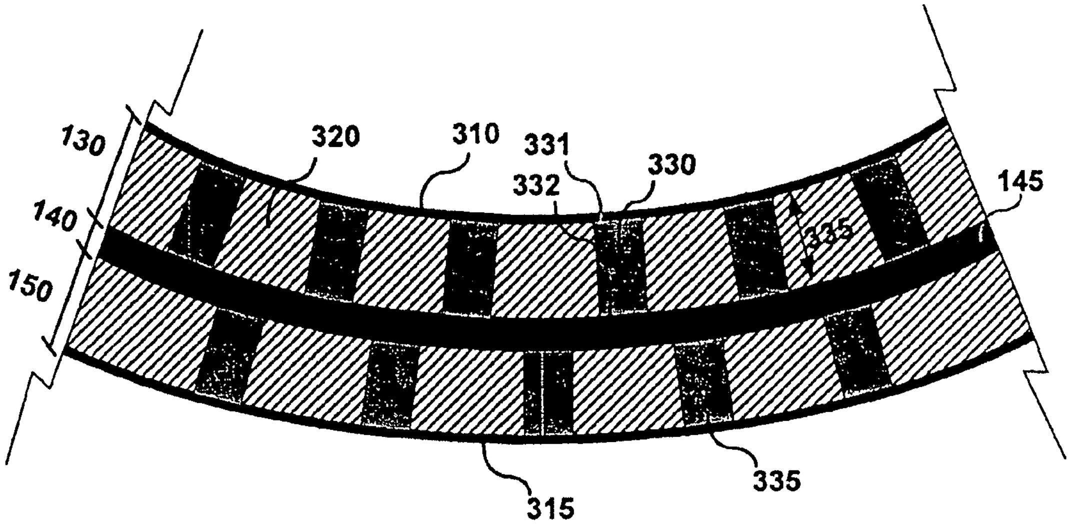
FIG. 3 shows an area of detail of the transformer coil assembly of FIG. 1.

FIG. 1 is a perspective view of a transformer coil assembly 100 according to an exemplary embodiment. The transformer coil assembly 100 includes a first layer 130 and a second layer 140. Referring also to FIG. 3, which details an area of the transformer coil assembly 100 of FIG. 1, a first layer 130 of the transformer coil assembly 100 includes means for establishing a support structure 310.

The means for establishing a support structure 310 can include multiple fibers interconnected to form a fabric. The fabric for vacuum or solid cast transformers can include glass fibers and can include electrical grade glass. Such fabric can include any of a variety of fibers that are known in this art to be suitable for transformer cast applications, such as polyphenylene sulfide (PPS), polyamides (nylon), polyvinyl chloride (PVC), flouropolymers (PTFE), and the like. The fabric for oil filled transformers can include paper, polyester, polyester film, aramid paper such as Nomex®, cellulose, Kraft paper, organic or inorganic paper, woven or non-woven fabric, and laminates such as DMD.

The first layer 130 of the transformer coil assembly 100 also includes buttons 330, affixed to the support structure means 310. The buttons 330 can include multiple buttons and is preferably formed of a less compressive material than fabric, such as resin or epoxy. The buttons 330 may be bonded to the support structure means 310 without using any adhesive by partially embedding the buttons 330 into the support structure means 310. This can be accomplished by, for example, applying epoxy material to the support structure 310 in liquid form and curing the liquid epoxy on the substrate to provide a solid homogenous button. The buttons 330 protrude from the support structure means 310 by a distance, i.e., height, 335. It should be appreciated that although the buttons 330 are shown affixed to only one surface of the support structure means 310, the buttons 330 can also be attached to both opposing surfaces of the support structure means 310.

The second layer 140 includes a conductor means 145 in contact with at least one of the buttons of the buttons 330 on a second side 332 of each button that opposes the first side 331. The conductor means 145 can be a single conductor that is wound continuously to form a single transformer coil winding, or can be multiple conductors, depending on the type of transformer coil assembly 100. The conductor means 145 can include tabs 160 for accessing the conductor means 145 by other electrical components outside the transformer coil assembly 100.

The transformer coil assembly 100 includes a dielectric means for covering the support structure means 310, the buttons 330, and the conductor means 145. The dielectric means can be a resin body 110 covering the layers of the transformer coil assembly 100. Although the dielectric means will be described hereinafter as a resin body 110, or simply resin 110, one of skill in this art will recognize that a number of dielectric materials may be used that are suitable for use in a transformer cast. The thickness of the resin body should be uniform to provide dielectric properties that are uniform throughout the transformer coil assembly. Here, the term uniform means substantially the same throughout with some tolerance. A dielectric with favorable properties will resist breakdown under high voltages, does not itself draw appreciable power from the circuit, is physically stable, and has characteristics that do not vary much over a fairly wide temperature range.

The transformer coil assembly 100 can optionally include a third layer 150 having support structure means 315 and buttons 335. The third layer 150 can be made of the same materials as the first layer, although this is not a requirement. When the optional third layer 150 is employed, the dielectric means, such as a resin body 110, can cover the first, second, and third layers 130, 140, 150, providing an overall thickness 160.

The means for establishing support structure 310 provides reinforcing support to the resin body 110 to prevent the development of cracks during casting or during use when the assembly is subjected to external conditions, such as high temperature, high humidity, moisture penetration and the like, or due to internal factors, such as high coil temperatures or vibratory forces during operation.

The buttons 330 protrude from the support structure means 310 by a distance 335. The protrusion of the buttons 330 creates a space 320 between conductor means 145 and the support structure means 310, where the resin 110 can more easily flow during the casting process. That is, without the buttons, the resin would have to "wick" into the support structure, which takes additional time and may produce uneven dispersion of the resin 110 and entrap air or voids in the multiple substrates which could initiate corona issues. Uneven dispersion produces a resin body 110 that does not have uniform dielectric properties. The buttons 330 provides a more even resin body 110 having more uniform dielectric properties than using, for example, a support structure 310 only.

Moreover, the height 335 of the buttons 330 can be selected to provide a desired overall thickness 120 of the first layer 130 using less support structure means 310, such as fabric. That is, to achieve the same thickness 120 of the first layer 130, and therefore the same dielectric properties, without the buttons 330, many layers of fabric would typically be required. The layers of fabric would not only cause uneven dispersing of the resin 110, as described above, but would be subject to compression by the conductor means 145 as the conductor means 145 is applied, e.g., wound, over the fabric layers. Compression is typically uneven and results in a non-uniform thickness of the first layer, causing non-uniform dielectric properties. The oil filled transformers also experience this limitation in their paper/pressboard configuration. The buttons 330 are therefore preferably less compressive, i.e., less subject to changes in volume when a force is applied, than the support structure means 310. For example, epoxy buttons are less compressive than layers of electrical grade glass.

Figure 2:
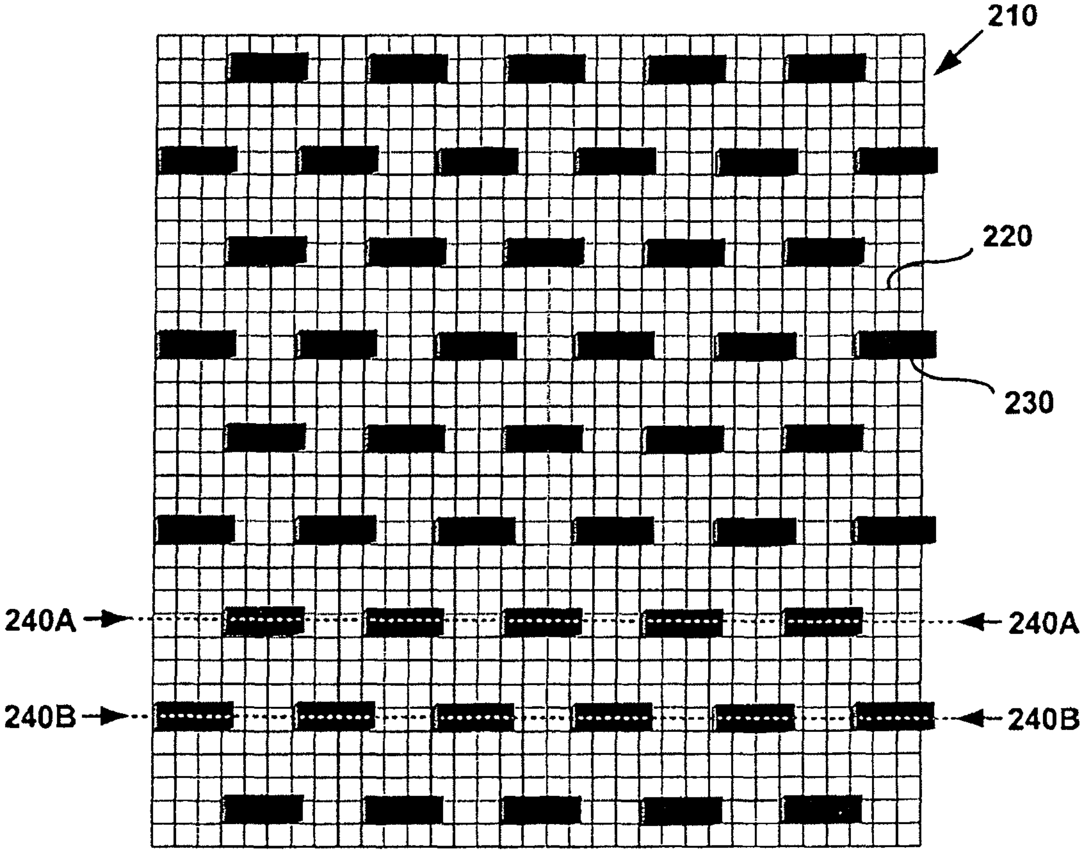
FIG. 2 shows a support structure and buttons.

FIG. 2 shows a support structure 210 with buttons 230. The support structure 210 includes a plurality of fibers 220 interconnected to form a fabric. Although a grid-like pattern is illustrated, any pattern can be used. Multiple buttons 230 are affixed to the fabric 210 and protruding from a surface of the fabric 210.

The buttons 230 can be arranged in a plurality of rows 240A, 240B. The rows 240A, 240B can be segmented as shown. FIG. 2 shows the buttons 230 arranged in one of many patterns that can be used. FIGS. 5A-5D show other possible patterns of the buttons that can be used.

Figure 4B:
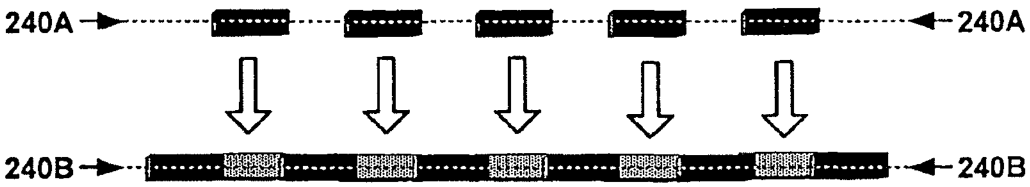
FIG. 4B illustrates a feature of a button pattern of FIG. 4A.
Figure 4A:
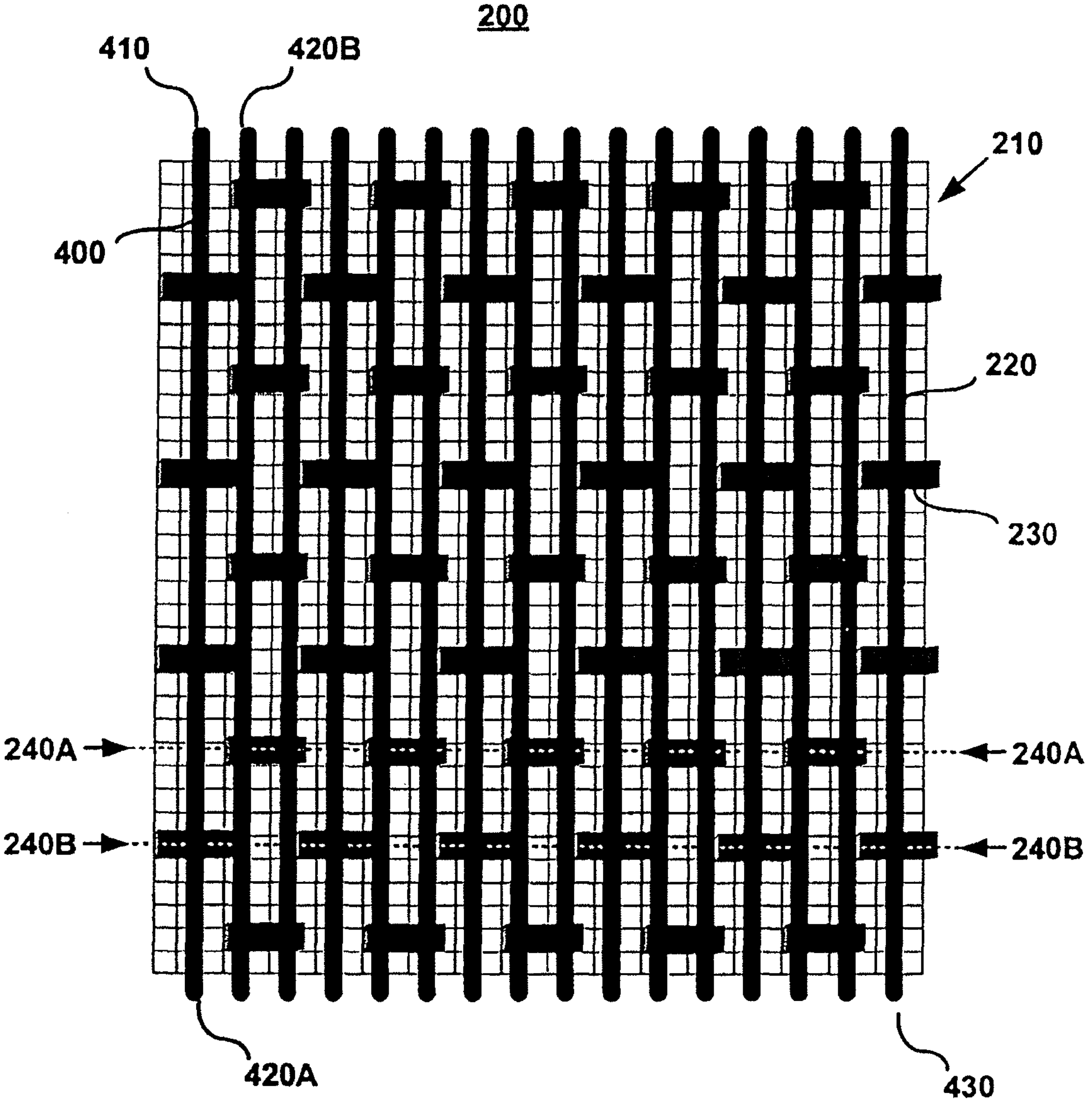
FIG. 4A shows a support structure, buttons, and a conductor.

FIG. 4A shows a support structure, buttons, and a conductor. The buttons 230 are shown arranged in a plurality of rows 240A, 240B. A conductor 430 has a first end 410 and a second end 430 and is continuous such that segment ends 420A and 420B are connected, i.e., represent the same point, and so on. The buttons 230 are shown arranged in a pattern so that the conductor 430 contacts only the buttons 230, and contacts a button 230 at least every two rows. This pattern provides support for the conductor 430 every two rows and can be configured for a narrow-width conductor 430 if needed.

Figure 5A:
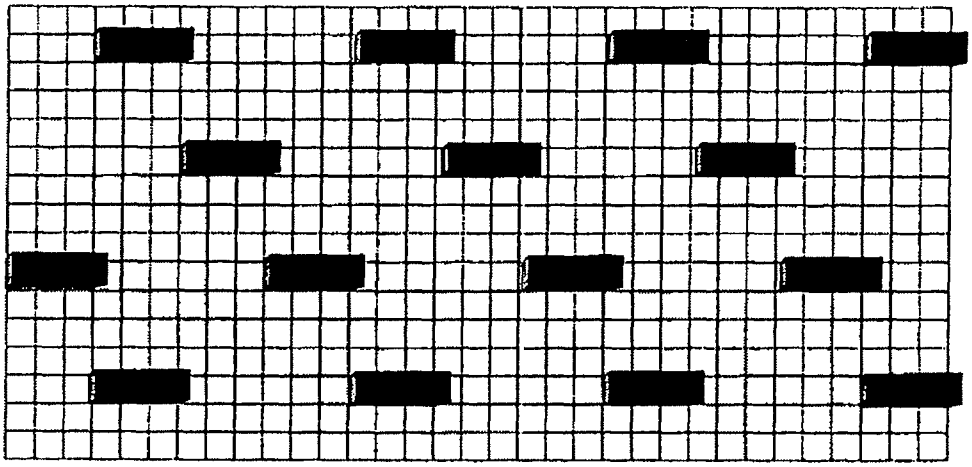
FIGS. 5A-5D show other possible arrangements of the buttons.
Figure 5B:
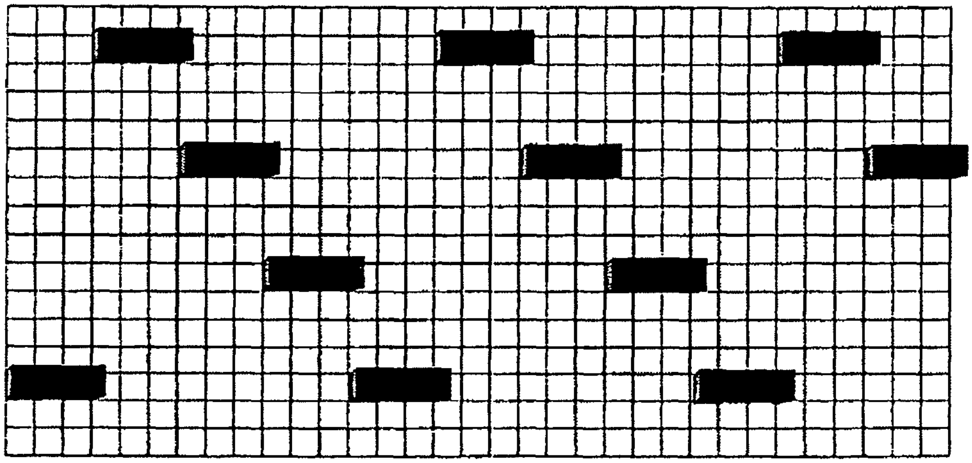

FIG. 4B illustrates this feature of the button pattern of FIG. 4A. The superimposition of row 240A onto 240B provides an unsegmented row of buttons. Here, the term "unsegmented" is meant to include both a contiguous row of adjacent buttons and a row of overlapping buttons. This feature helps define the pattern of FIG. 4A. Likewise, as can be appreciated, in the pattern of FIG. 5A, the superimposition of three rows onto each other provides an unsegmented row of buttons. In FIG. 5B, the superimposition of four rows onto each other provides an unsegmented row of buttons. In FIGS. 5A and 5B, the respective pattern provides support for the conductor 430 every three rows and every four rows. This can be expanded to any number of rows. In addition, for a conductor 430 having a narrower width implemented in an oil filled transformer, the buttons need not be offset. Also, for wider conductors 410 in oil filled transformers, the supports may be continuous.

Figure 5C:
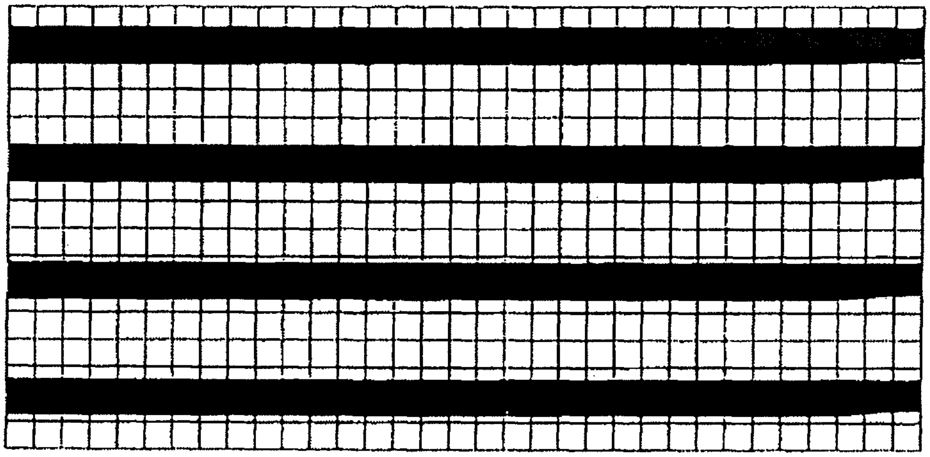
Figure 5D:
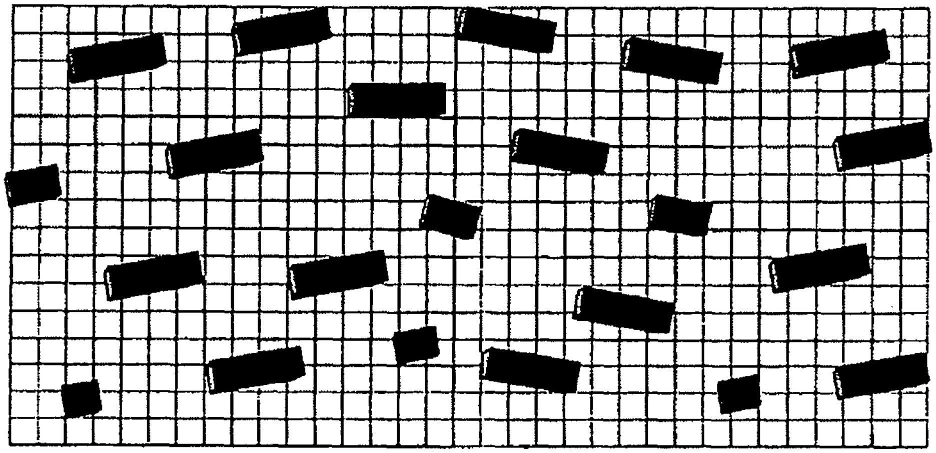

As can be appreciated from FIG. 5C, the rows need not be segmented, although it is preferable as discussed below. Moreover, as can be appreciated from FIG. 5D, the buttons can be of varying sizes and patterns, and need not be in rows. The button pattern can be purely random if desired.

According to an embodiment of the invention, the buttons are integrally molded to the body of the substrate. A solid state transformer coil assembly, according to an exemplary embodiment of the invention, includes a dielectric substrate, the coil windings provided around the substrate, and an epoxy compound encapsulating the substrate and the coil windings. Alternatively, "oil filled" transformer coil assemblies may be suspended in fluid after the coils, including paper insulator layers, are wound around the substrate.

The substrate is provided with raised buttons comprising the same epoxy material as the epoxy compound used for encapsulation. The buttons are molded onto the dielectric substrate and maintain a specific distance between the coil and the dielectric substrate. The buttons are arranged such that they support the windings and allow the encapsulating epoxy to flow around them flooding the entire mold without entrapping air or creating voids. In embodiments of the invention, the buttons may be designed with a profile that facilitates encapsulation eliminating voids and potential for transformer failure due to corona discharge. Further, the buttons can be designed and shaped in various patterns to accommodate non-conventional transformer configurations.

The buttons may be bonded to many types of substrate used in vacuum or solid cast as well as oil filled transformers, including material such as, but not limited to, e-glass, paper, polyester, polyester film, aramid material such as Nomex®, cellulose, Kraft paper, and laminates such as DMD. The material used for dielectric substrate may be organic or non-organic. The material may also be woven or nonwoven. The dielectric substrate may be made material such as, but not limited to, fibers formed in grid-like pattern, formed as a solid surface, or formed in parallel continuous or non-continuous rows. The buttons may be bonded over the substrate without using any adhesive material.

Figure 6:
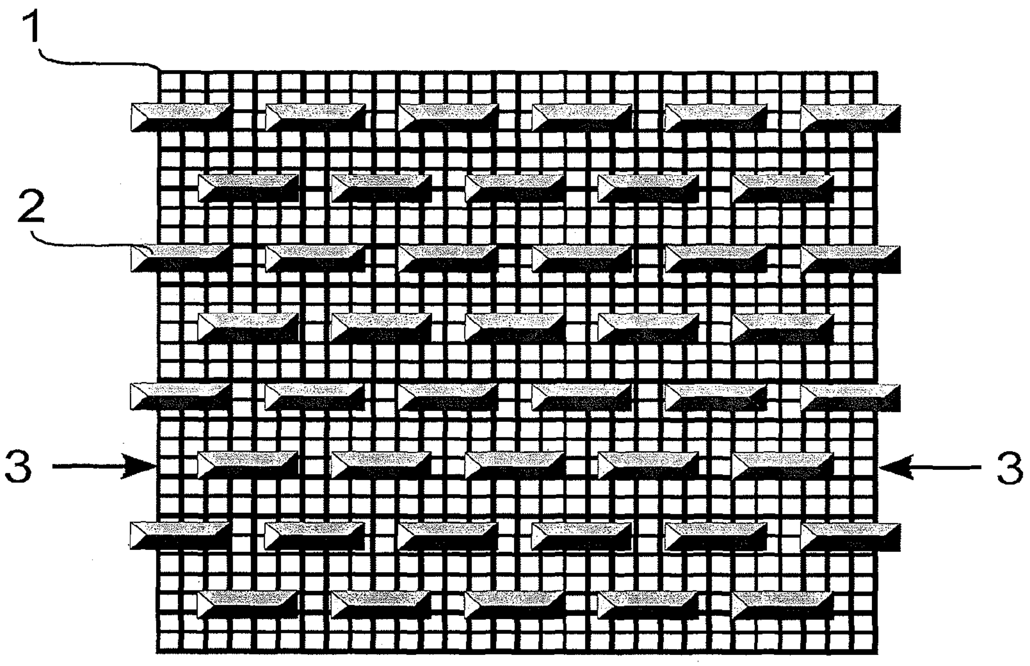
FIG. 6 depicts an exemplary arrangement of buttons molded onto a mesh style dielectric substrate, according to an embodiment of the invention.

FIG. 6 depicts an exemplary arrangement of buttons molded onto a mesh style dielectric substrate, according to an embodiment of the invention. In this figure, a mesh style dielectric substrate 1 are provided with pyramidal shaped epoxy buttons 2 molded onto it. The buttons may be configured in a pattern such that when the substrate is rolled into a cylindrical bobbin 6 and the conductors 4 are wound around it, the wires bridge over the substrate supported by the buttons creating the requisite gap space 5.

Figure 7:
FIG. 7 shows a cross-sectional view of the buttons molded onto the substrate according to an embodiment of the invention.

The width of the gap space is determined by the height of the button as can be seen in the cross-sectional view in FIG. 7 along line 3. The buttons are staggered so that during the encapsulation process the epoxy can flow around them easily whether it is fed from the top or the bottom. When the encapsulation epoxy is used to mold the buttons the whole resin body is homogeneous when it is cast thereby making the heat exchange consistent through out the resin body. When the same epoxy is used for encapsulation and molding the buttons there are no stress lines due to dissimilar coefficients of heat expansion. When the same epoxy is used for encapsulation and molding the buttons there are no stress faults or shear lines due to the perfect adhesion between the encapsulating resin and the buttons.

Figure 8:
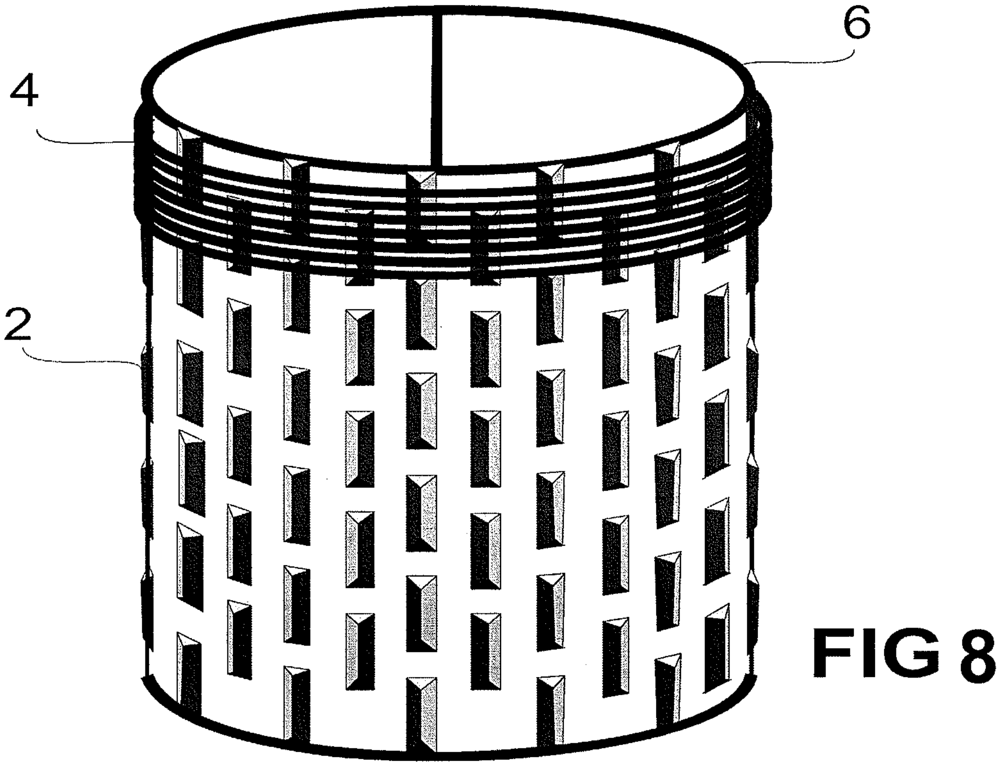
FIG. 8 shows a perspective view of the substrate rolled into a bobbin according to an embodiment of the invention.
Figure 9:
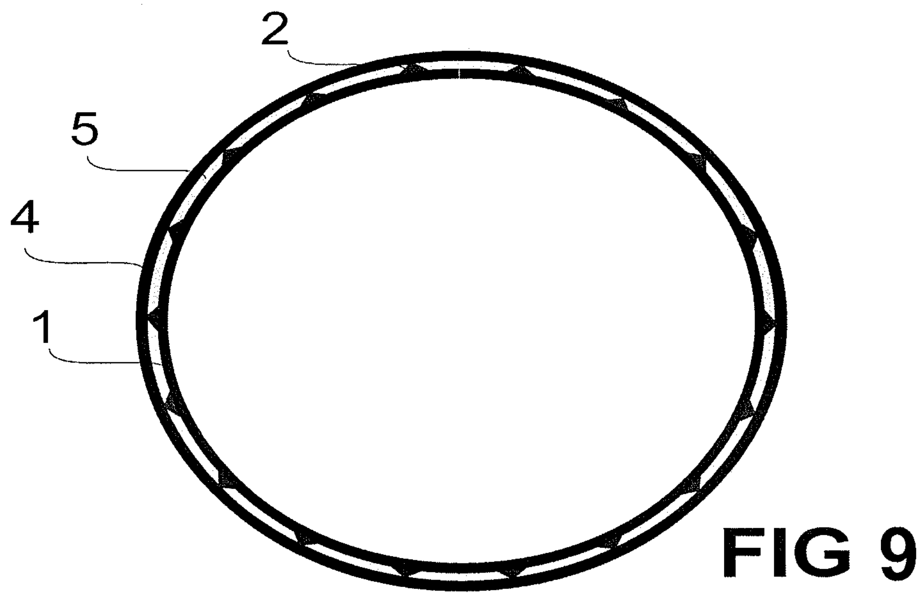
FIG. 9 shows a top view of the bobbin configuration according to an embodiment of the invention.

FIG. 8 shows a perspective view of the substrate rolled into a bobbin according to an embodiment of the invention. FIG. 9 shows a top view of the bobbin configuration according to an embodiment of the invention. When the epoxy fully encapsulates the coils and the dielectric substrate, thus forming a solid mono-block of homogeneous epoxy. The transformer coil may comprise several layers of these materials, i.e., additional layers of dielectric substrates may be provided, as well as additional layers of coil windings and epoxy resin.

According to an embodiment of the invention, the epoxy buttons are molded to the dielectric substrate prior to encapsulation to ensure a consistent distance between the substrate and the windings. The buttons are made substantially of the same or similar epoxy material used for encapsulating the transformer coil assembly. The buttons are molded onto the dielectric substrate in such a manner as to support the windings prior to encapsulation. The buttons are sized and shaped to facilitate the air free encapsulation of the coil with epoxy.

What is claimed as new and desired to be protected by Letters Patent of the United States is:

1. A transformer coil assembly, comprising:

a substrate having a plurality of fibers interconnected to form a fabric and a plurality of buttons comprising epoxy material, each button being molded on a first side of the button to the fabric and protruding from a first surface of the fabric, the substrate being rolled into a cylindrical bobbin with the first surface being the outer surface of the bobbin;

a plurality of wires being wound around the bobbin and in contact with at least one of the plurality of buttons on a second side of each button that opposes the first surface such that a gap is created between the substrate and the wires; and a resin body comprising epoxy substantially similar to the epoxy material of the buttons, the resin body covering the substrate and the wires.

2. The transformer coil assembly of claim 1, wherein the substrate comprises dielectric material comprising at least one of e-glass, paper, polyester, polyester film, aramid paper, cellulose, Kraft paper, organic or inorganic paper, woven fabric, non-woven fabric, or laminates.

3. The transformer coil assembly of claim 1, wherein the substrate comprises dielectric material comprising at least one of paper, aramid paper, cellulose, Kraft paper, organic paper and inorganic paper.

4. The transformer coil assembly of claim 1, wherein the substrate comprises dielectric material comprising at least one of woven fabric, non-woven fabric, and laminates.

* * * * *